(12) United States Patent
Fu et al.

(10) Patent No.: US 11,437,245 B2
(45) Date of Patent: Sep. 6, 2022

(54) GERMANIUM HUMP REDUCTION

(71) Applicant: Taiwan Semiconductor Manufacturing Company, Ltd., Hsin-Chu (TW)

(72) Inventors: Shih-Hao Fu, Hsinchu (TW); Hung-Ju Chou, Hsinchu (TW); Che-Lun Chang, Hsinchu (TW); Jiun-Ming Kuo, Taipei (TW); Yuan-Ching Peng, Hsinchu (TW); Sung-En Lin, Hsinchu (TW); Nung-Che Cheng, Hsinchu (TW); Chunyao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/038,258

(22) Filed: Sep. 30, 2020

(65) Prior Publication Data

US 2022/0102151 A1 Mar. 31, 2022

(51) Int. Cl.
*H01L 21/308* (2006.01)
*H01L 29/66* (2006.01)
(Continued)

(52) U.S. Cl.
CPC ...... *H01L 21/3085* (2013.01); *H01L 21/0217* (2013.01); *H01L 21/0228* (2013.01);
(Continued)

(58) Field of Classification Search
CPC ........... H01L 221/0337; H01L 21/0276; H01L 21/0332; H01L 21/32139; H01L 21/31116
See application file for complete search history.

(56) References Cited

U.S. PATENT DOCUMENTS 5,260,251 A * 11/1993 Kountz ............... H01L 39/2451
505/476
8,753,975 B1 * 6/2014 Zhang ............... H01L 23/53238
438/637
(Continued)

OTHER PUBLICATIONS

K. Prabhakaran, F. Maeda, Y. Watanabe, T. Ogino, Thermal decomposition pathway of Ge and Si oxides: observation of a distinct difference, Thin Solid Films 369 (2000) 289-292.
(Continued)

*Primary Examiner* — Brigitte A Paterson
*Assistant Examiner* — Andre C Stevenson
(74) *Attorney, Agent, or Firm* — Haynes and Boone, LLP

(57) ABSTRACT

The present disclosure provides methods of forming semiconductor devices. A method according to the present disclosure includes receiving a workpiece that includes a stack of semiconductor layers, depositing a first pad oxide layer on a germanium-containing top layer of the stack, depositing a second pad oxide layer on the first pad oxide layer, depositing a pad nitride layer on the second pad oxide layer, and patterning the stack using the first pad oxide layer, the second pad oxide layer, and the pad nitride layer as a hard mask layer. The depositing of the first pad oxide layer includes a first oxygen plasma power and the depositing of the second pad oxide layer includes a second oxygen plasma power greater than the first oxygen plasma power.

20 Claims, 14 Drawing Sheets

(51) Int. Cl.
*H01L 29/423* (2006.01)
*H01L 29/786* (2006.01)
*H01L 21/02* (2006.01)
*H01L 29/06* (2006.01)

(52) U.S. Cl.
CPC .. *H01L 21/02164* (2013.01); *H01L 21/02274* (2013.01); *H01L 21/02532* (2013.01); *H01L 21/02603* (2013.01); *H01L 21/3081* (2013.01); *H01L 21/3086* (2013.01); *H01L 29/0673* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,818,872 | B2 | 11/2017 | Ching et al. |
| 9,887,269 | B2 | 2/2018 | Ching et al. |
| 9,899,398 | B1 | 2/2018 | Colinge et al. |
| 10,032,627 | B2 | 7/2018 | Lee et al. |
| 10,109,721 | B2 | 10/2018 | Lin et al. |
| 10,157,799 | B2 | 12/2018 | Ching et al. |
| 10,199,502 | B2 | 2/2019 | Huang et al. |
| 10,290,546 | B2 | 5/2019 | Chiang et al. |
| 10,475,902 | B2 | 11/2019 | Lee et al. |
| 2002/0094649 | A1* | 7/2002 | Arthanari .......... H01L 21/76229 438/296 |
| 2005/0250287 | A1* | 11/2005 | Chen ................. H01L 29/6656 257/E29.267 |
| 2014/0217588 | A1* | 8/2014 | Zhang ............... H01L 21/76843 257/751 |
| 2016/0005735 | A1* | 1/2016 | Costrini ........... H01L 21/76224 257/401 |
| 2016/0079087 | A1* | 3/2016 | Yeduru ............. H01L 21/02063 257/773 |
| 2018/0175036 | A1 | 6/2018 | Ching et al. |
| 2019/0345608 | A1* | 11/2019 | Agarwal .......... C23C 16/45553 |

OTHER PUBLICATIONS

Thomas D. Schladt, Kerstin Schneider, Hansjorg Shild and Wolfgang Tremel, Synthesis and bio-functionalization of magnetic nanoparticles for medical diagnosis and treatment, The Royal Society of Chemistry 2011, Dalton Trans., 2011, 40, 6315-6343.

* cited by examiner

GERMANIUM HUMP REDUCTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures.

Formation of MBC transistors involves patterning an epitaxial layer stack into a fin-shaped structure. In instances where a top layer of the epitaxial layer stack is a germanium-containing layer, such as a silicon germanium layer, the germanium content in the top layer may form protrusive humps during deposition of a hard mask layer. The protrusive humps may result in nonuniformed fin-shaped structures due to delamination of the hard mask layer or nonhomogeneous compositions in the top layer. Therefore, while existing processes to form MBC transistors are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
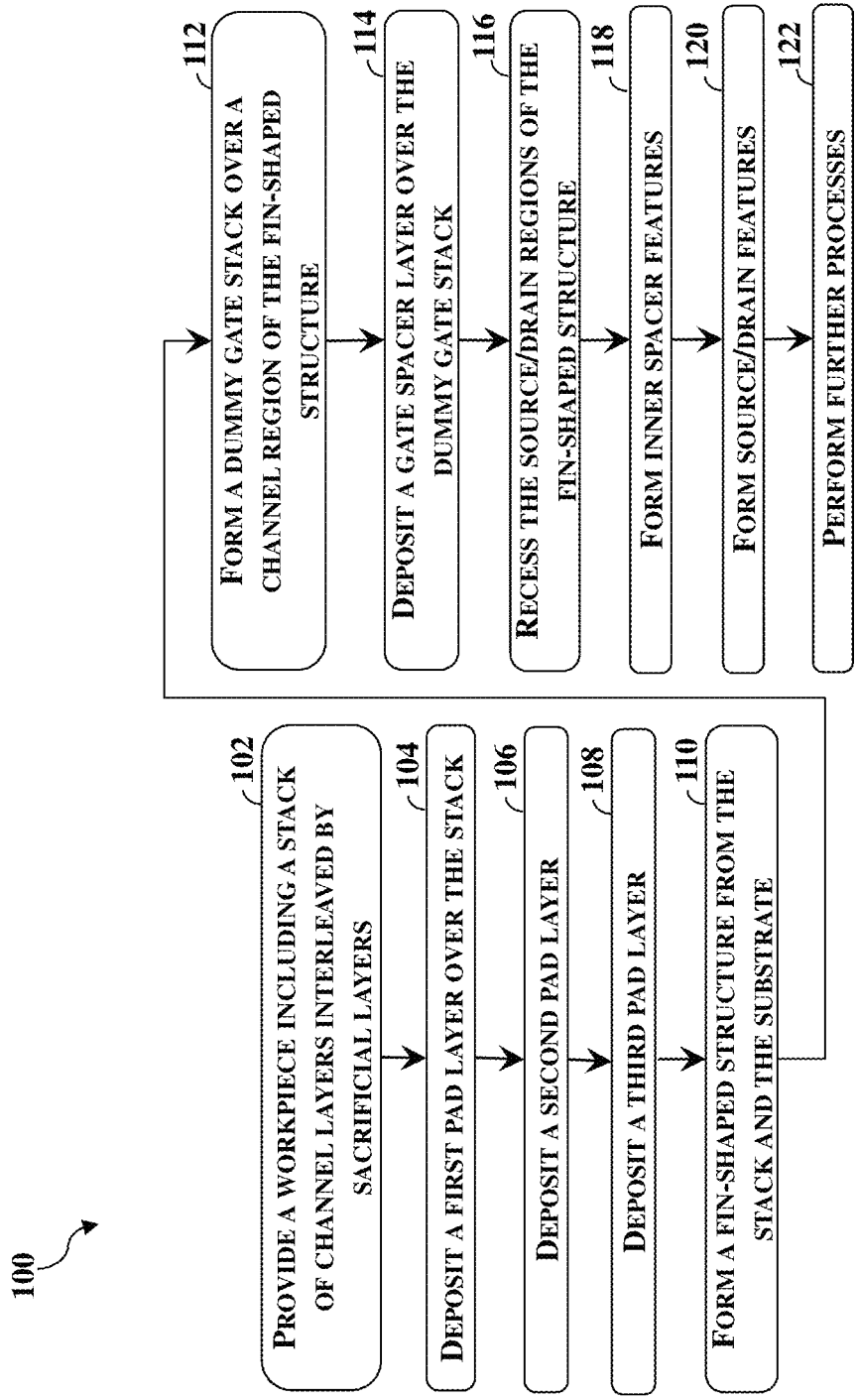
FIG. 1 illustrates a flowchart of a method for forming a semiconductor device, according to one or more aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to methods of forming MBC transistors, and more particularly to methods of forming a fin-shaped structure from a stack that includes a germanium-containing top layer.

Multi-gate devices include transistors whose gate structures are formed on at least two-sides of a channel region. Examples of multi-gate devices include fin-like field effect transistors (FinFETs) having fin-like structures and MBC transistors having a plurality of a channel members. As described above, MBC transistors may also be referred to as SGTs, GAA transistors, nanosheet transistors, or nanowire transistors. An MBC transistor includes any device that has its gate structure, or portion thereof, formed on 4-sides of a channel region (e.g., surrounding a portion of a channel region). MBC devices according to the present disclosure may have channel regions disposed in nanowire channel members, bar-shaped channel members, nanosheet channel members, nanostructure channel members, column-shaped channel members, post-shaped channel members, and/or other suitable channel configurations. MBC transistors may be either n-type or p-type.

Formation of an MBC transistor includes formation of a fin-shaped structure from a stack of semiconductor layers. Such a stack may include, for example, a plurality of silicon layers and a plurality of germanium-containing layers. In some examples, the stack may be configured to have a germanium-containing layer as a topmost layer to meet various design requirements. Such design requirements may include prevention of damages to the topmost channel members, formation of p-type MBC transistors, or yield improvement. To pattern the stack to form the fin-shaped structure, a hard mask layer is formed on the topmost layer. When the topmost layer includes germanium and the hard mask layer includes silicon oxide or silicon nitride, germanium humps (or germanium bumps) may be formed at the interface between the topmost layer and the hard mask layer. Such germanium humps may coalesce and gain in dimensions. It is observed that germanium humps may cause delamination of the hard mask layer, voids in the topmost layer, or nonuniform etching of the stack, which may lead to defects and reduced yield.

The present disclosure provides methods of forming MBC transistors with an improved yield. Such methods may include forming a pad oxide layer using a low-level of oxygen plasma, forming a pad nitride layer using plasma-enhanced atomic layer deposition (PEALD) or plasma-enhanced chemical vapor deposition (PECVD) at a low temperature between about 350° C. and about 450° C., or a combination thereof. Use of low-level oxygen plasma may minimize the generation of germanium oxide, which is a reactant in a reduction chemical reaction to form germanium. The low temperature during the formation of the pad nitride layer may slow down the reduction chemical reaction of germanium oxide to form germanium. By lessening germanium oxide formation and/or slowing down the reduction reaction of germanium oxide, method of the present disclosure may reduce the number of germanium humps or reduce the dimensions of germanium humps, thereby improving uniformity of fin-shaped structures and overall yield.

Figure 2:
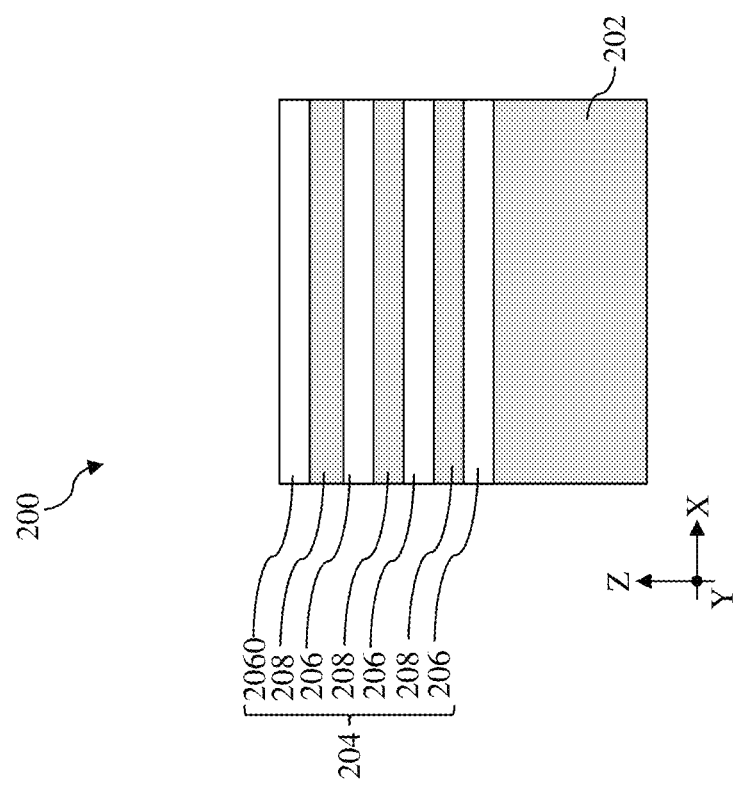
FIGS. 2-13 illustrate fragmentary cross-sectional views of a workpiece during a fabrication process according to the method of FIG. 1, according to one or more aspects of the present disclosure.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-13, which are fragmentary cross-sectional views of a workpiece 200 at different stages of fabrication according to embodiments of the method 100 in FIG. 1. For avoidance of doubts, the X, Y and Z directions in FIGS. 2-13 are perpendicular to one another and are used consistently throughout FIGS. 2-13. Because the workpiece 200 will be fabricated into a semiconductor device, the workpiece 200 may be referred to herein as a semiconductor device 200 as the context requires Referring to FIGS. 1 and 2, method 100 includes a block 102 where a workpiece 200 is provided. As shown in FIG. 2, the workpiece 200 includes a substrate 202 and a stack 204 of semiconductor layers. In some embodiments, the substrate 202 may be a semiconductor substrate such as a silicon substrate. The substrate 202 may include various doping configurations depending on design requirements as is known in the art. Depending on the type of devices to be formed on the substrate 202, the substrate 202 may include an n-type doping profile (i.e., an n-type well or n-well) or a p-type doping profile (i.e., a p-type well or p-well). N-type dopant(s) for forming the n-type well may include phosphorus (P), arsenic (As), or antimony (Sb). P-type dopant(s) for forming the p-type well may include gallium (Ga) or boron (B). The suitable doping may include ion implantation of dopants and/or diffusion processes. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer, may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. The first and second semiconductor composition may be different. In some embodiments, the sacrificial layers 206 include silicon germanium (SiGe) and the channel layers 208 include silicon (Si). In some alternative embodiments, the sacrificial layers 206 include silicon germanium (SiGe) and the channel layers 208 include germanium (Ge). In still other embodiments, both sacrificial layers 206 and the channel layers 208 include silicon germanium and a germanium content of the sacrificial layers 206 is greater than a germanium content of the channel layers 208. As shown in FIG. 2, besides the sacrificial layers 206 and channel layers 208, the stack 204 further includes a top layer (or a topmost layer) 206O. The top layer 206O includes germanium. In some instances, a composition of the top layer 206O may be similar, or identical, to a composition of the sacrificial layers 206. In one embodiment, the top layer 206O include silicon germanium (SiGe). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness and all of the channel layers 208 may have a substantially uniform second thickness. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel region(s) for a subsequently-formed multi-gate device and the thickness of each of the sacrificial layers 206 is chosen based on device performance considerations. Like the sacrificial layers 206, the top layer 206O also serves as a sacrificial layer to protect the topmost channel layer 208.

The top layer 2060 has a third thickness. Depending on process parameters and the level of protection intended for the channel layers 208, the third thickness may be smaller than or greater than the first thickness.

The layers in the stack 204 may be deposited using a molecular beam epitaxy (MBE) process, a metalorganic chemical vapor deposition (MOCVD) process, and/or other suitable epitaxial growth processes. As stated above, in at least some examples, each of the sacrificial layers 206 includes an epitaxially grown silicon germanium (SiGe) layer, each of the channel layers 208 includes an epitaxially grown silicon (Si) layer, and a composition of the top layer 2060 may be similar, or identical, to a composition of the sacrificial layers 206. The top layer 2060 In some embodiments, the sacrificial layers 206 and the channel layers 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth processes for the stack 204.

Figure 3:
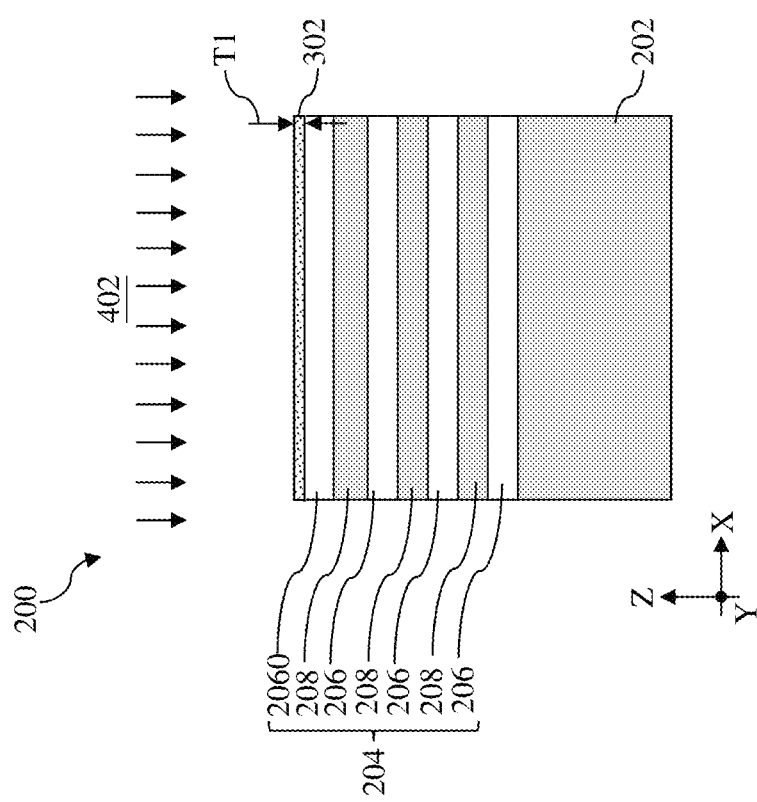

Referring to FIGS. 1 and 3, method 100 includes a block 104 where a first pad layer 302 is deposited over the stack 204. The first pad layer 302 includes silicon oxide and may be referred to as a first pad oxide layer 302. In the depicted embodiment, the first pad layer 302 may be deposited using a first plasma-enhanced atomic layer deposition (PEALD) process 402. In an example first PEALD process 402, a silicon-containing precursor, such as silane ($SiH_4$), and an oxygen-containing precursor, such as oxygen ($O_2$), are alternatingly supplied in an PEALD chamber where the workpiece 200 is situated. In some instances, the process temperature of the first PEALD process 402 to form the first pad layer 302 is between about 200° C. and about 300° C. In the first PEALD process 402, the oxygen-containing precursor, such as oxygen, may be supplied in the form of inductively coupled radio oxygen plasma, capacitively coupled plasma, or remotely generated plasma. The first PEALD process 402 is configured to reduce oxidation of the germanium content in the top layer 2060. As compared to the second PEALD process 404 to form a second pad layer 304 at block 106 (to be described below), the first PEALD process 402 at block 104 includes a low level (LL) of radio-frequency (RF) plasma power when the oxygen-containing precursor is supplied to the PEALD chamber. In some instances, such a low level (LL) of RF plasma power is between about 150 Watts (W) and about 400 W. In this range of low-level RF plasma power, 150 W is about the lowest power available for commercially available PEALD equipment. With respect to the upper bound-400 W, it is observed when the RF plasma power exceeds 400 W, it is more likely than not that too much germanium oxide may be formed. As shown in FIG. 3, the first pad layer 302 may have a first thickness T1 along the Z direction and the first thickness T1 is between about 8 Å and about 12 Å.

Figure 4:
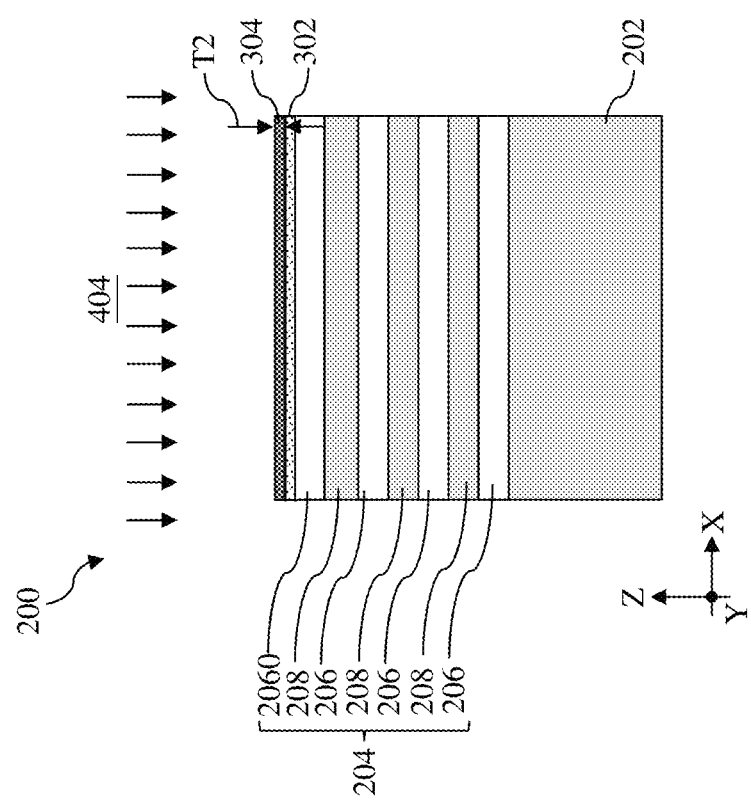

Referring to FIGS. 1 and 4, method 100 includes a block 106 where a second pad layer 304 is deposited on the first pad layer 302. The second pad layer 304 includes silicon oxide and may be referred to as a second pad oxide layer 304. In the depicted embodiment, the second pad layer 304 may be deposited using a second PEALD process 404. In an example second PEALD process 404, a silicon-containing precursor, such as silane ($SiH_4$), and an oxygen-containing precursor, such as oxygen ($O_2$), are alternatingly supplied in an PEALD chamber where the workpiece 200 is situated. In some instances, the process temperature of the second PEALD process 404 to form the second pad layer 304 is between about 200° C. and about 300° C. In the second PEALD process 404, the oxygen-containing precursor, such as oxygen, may be supplied in the form of inductively coupled radio oxygen plasma, capacitively coupled plasma, or remotely generated plasma. As compared to the first PEALD process to form the first pad layer 302 at block 104, the second PEALD process 404 at block 106 includes a high level (HL) of RF plasma power when the oxygen-containing precursor is supplied to the PEALD chamber. The high level (HL) of RF plasma power at block 106 may be about 2 time and about 3 times of the low level (LL) of RF plasma power at block 104. That is, a ratio (HL/LL) of the high level (HL) of RF plasma power at block 106 to the low level (LL) of RF plasma power at block 104 may be between about 2 and about 3. It is observed that if the high level (HL) of RF plasma power at block 106 is less than 2 time of the low level (LL) of RF plasma power at block 106, the quality of the second pad layer 304 may not be sufficient. However, a high level (HL) greater than 3 time of the low level (LL) does not yield additional benefits in terms of the etch resistance. In some instances, such a high level (HL) of RF plasma power is between about 550 Watts (W) and about 800 W. This range of high-level RF plasma power is selected to form a dense, high-quality, and etch resistant silicon oxide layer. As shown in FIG. 4, the second pad layer 304 may include a second thickness T2 along the Z direction and the second thickness T2 is between about 8 Å and about 12 Å.

Between the first pad layer 302 and the second pad layer 304, the first pad layer 302 is of a lower quality than the second pad layer 304 at least in terms of etch resistance. It is observed that DHF (diluted hydrogen fluoride) etches a 20 Å-thick of the first pad layer 302 (lower quality) at a rate about 280 nm/minute to about 320 nm/minute but etches a 20 Å-thick of the second pad layer 304 (higher quality) at a rate about 65 nm/minute to about 75 nm/minute. In this regard, the first pad layer 302 may also be referred to as a high-quality pad oxide layer 302 and the second pad layer 304 may also be referred to as a low-quality pad oxide layer 304. When only the first pad layer 302 is formed to a total thickness of the first thickness T1 and the second thickness T2, it may not provide sufficient etch resistance and lead to defects. This is why low-quality pad oxide layer, such as the first pad layer 302, is not used in some conventional technology because its fast etch rate disqualifies it as part of a hard mask layer. However, as described above, when only the second pad layer 304 is formed to a total thickness of the first thickness T1 and the second thickness T2, the high level RF plasma power may lead to excessive germanium oxide. To address this dilemma identified in the present disclosure, a series of experiments is conducted. According to these experiments, when a ratio of the first thickness T1 to the second thickness T2 is about 1:1, etch resistance of the combination of the first pad layer 302 and the second pad layer 304 rivals etch resistance of the second pad layer 304 of a total thickness of the first thickness T1 and the second thickness T2. For example, DHF etches a combination of a 10 Å-thick first pad layer 302 and a 10 Å-thick second pad layer 302 at about 70 nm/minute.

Figure 5:
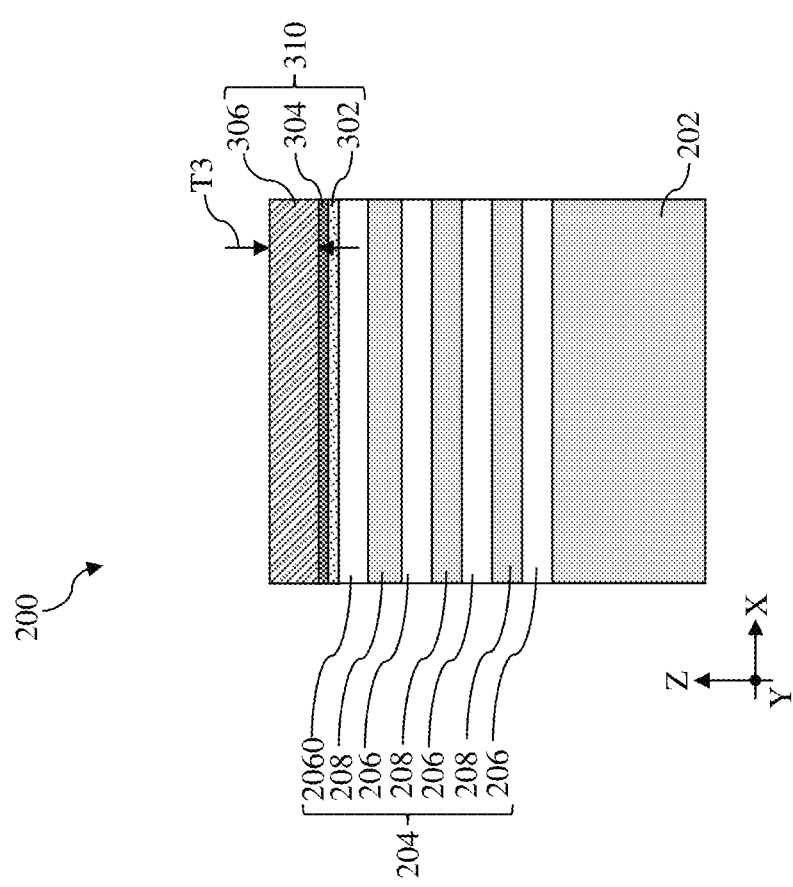
Figure 14:
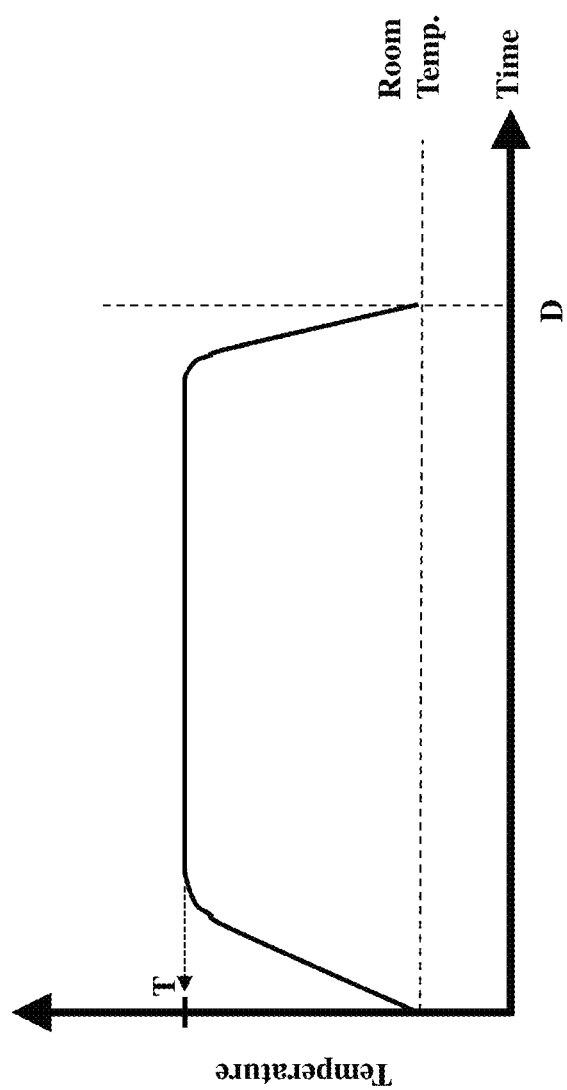
FIG. 14 illustrates change of process temperature over process time in an example deposition process for operations at block 108 of the method in FIG. 1, according to one or more aspects of the present disclosure.

Referring to FIGS. 1 and 5, method 100 includes a block 108 where a third pad layer 306 is deposited. In some embodiments, the third pad layer 306 includes silicon nitride and may be referred to as a pad nitride layer 306. The deposition of the third pad layer 306 is configured to introduce minimal thermal energy. By way of example, the process temperature and process time of the deposition of the third pad layer 306 is illustrated in FIG. 14. In some embodiments, the third pad layer 306 is deposited using PECVD or plasma-enhanced atomic layer deposition (PEALD). As shown in FIG. 14, the process temperature at block 108 may be ramped up from about room temperature (i.e., room temp.) to a steady-state temperature T (i.e., process temperature T) and then ramped back down to room temperature within a process time (i.e., duration) D. In some implementations, the process temperature T may be between about 350° C. and about 450° C. and the process time D may be between about 25 minutes and about 35 minutes. Such a process temperature T is much lower than the temperature required to deposit the third pad layer 306 using CVD, which is between about 500° C. and about 600° C. Further, in embodiments where the third pad layer 306 is deposited using PECVD or PEALD. Such a process time T is a lot less than the process time required to deposit the third pad layer 306 using CVD, which is between about 3 hours and 5 hours. It can be seen that, by employing a lower process temperature T and a shorter process time D, the deposition of the third pad layer 306 at block 108 introduce less thermal energy to the workpiece.

While method 100 in FIG. 1 includes blocks 104, 106 and 108, various alternative embodiments are possible. One of the intended purpose of method 100 is to reduce the number or dimensions of germanium humps that extend from the top layer 2060 into the first pad layer 302 or even into the second pad layer 304. The formation of such germanium humps may be broken down into two stages—an oxidation stage followed by a reduction stage. The oxidation stage may be described by the following chemical equation (1):

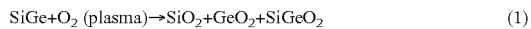

SiGe+O₂ (plasma)→SiO₂+GeO₂+SiGeO₂ (1)

The reduction stage may be described by the following chemical equation (2):

GeO₂ + SiGeO₂ $\xrightarrow{\Delta}$ SiO₂ + Ge (2)

In chemical equation (1), when the top layer 2060 includes silicon germanium (SiGe), silicon germanium may be oxidized in the oxygen plasma to produce silicon dioxide (SiO₂), germanium oxide (GeO₂), and silicon germanium oxide (SiGeO₂). In chemical equation (2), germanium oxide (GeO₂) and silicon germanium oxide (SiGeO₂) may be reduced to form germanium and the reduction reaction requires thermal energy (i.e., heat). Germanium precipitation (in the form of germanium dots) from chemical equation (2) may merge to form germanium humps (or germanium particles) and as the precipitation continues, the germanium humps may grow in size. Over time, the composition of the top layer 2060 may change and become less uniform. Nonuniformity of the top layer 2060 may lead to defects when the top layer 2060 is used in patterning the stack 204. In one aspect, operations at block 104 is designed to decrease production of germanium oxide (GeO₂) in chemical equation (1) by reducing the radio frequency (RF) power of the oxygen plasma. In another aspect, operations at block 108 are designed to decrease thermal energy (i.e., heat) input to drive the reduction reaction (2) to the right-hand side. By using PEALD or PECVD, block 108 employs lower process temperature between about 350° C. and about 450° C. and lasts for a shorter process time between about 25 minutes and about 35 minutes. While inclusion of both blocks 104 and 108 reduces the numbers and dimensions of germanium humps, reduction of germanium humps does not require all of them. It is observed that a first alternative embodiment of method 100 may reduce the numbers and dimensions of germanium humps if it includes block 108 but omits block 104. Similarly, a second alternative embodiment of method 100 may reduce the numbers and dimensions of germanium humps if it includes block 104 but omits block 108.

In a first alternative embodiment, block 104 is omitted and the second pad layer 304 at block 106 of method 100 is formed to a combined thickness of the first thickness T1 and the second thickness T2, which is between about 16 Å and about 24 Å. In this first alternative embodiment, while germanium oxide (GeO₂) is produced in chemical equation (1), block 108 operates to reduce thermal energy input in chemical equation (2), thereby decreasing germanium generation. In a second alternative embodiment, block 108 of method 100 may be replaced by deposition of a CVD silicon nitride layer at a process temperature between about 500° C. and about 600° C. and for a duration between about 3 hours and about 5 hours. In the second alternative embodiment, while thermal energy is input in the chemical equation (2) during the deposition of the CVD silicon nitride layer to drive the reaction to the right-hand side, block 104 operates to decrease germanium oxide (GeO₂), a reactant of chemical equation (2). Flowcharts consistent with the first alternative embodiment and the second alternative embodiments are not separately illustrated for brevity.

Figure 6:
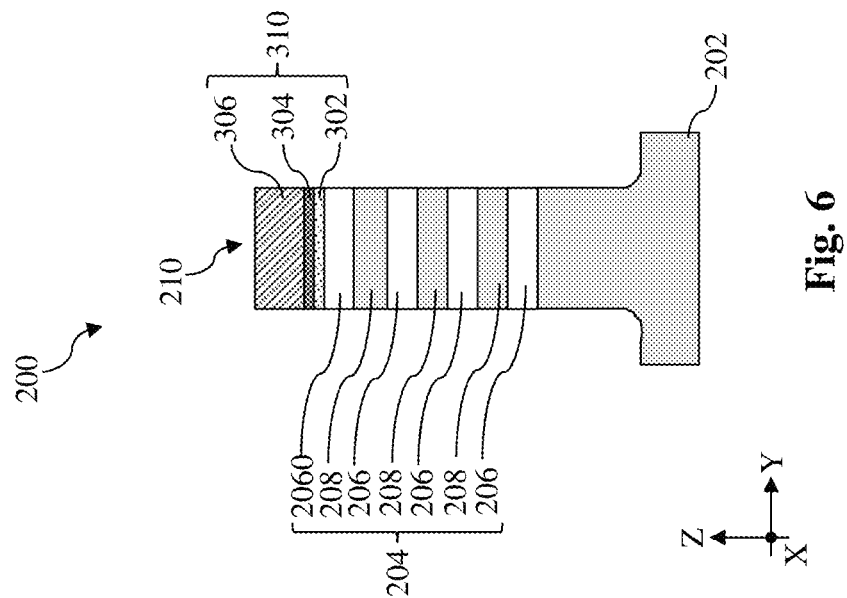

Referring to FIGS. 1, 5, 6, and 7, method 100 includes a block 110 where a fin-shaped structure 210 is formed from the stack 204 and the substrate 202. The first pad layer 302, the second pad layer 304 and the third pad layer 306 shown in FIG. 5 collectively constitute a hard mask layer 310. Because the hard mask layer 310 is used to pattern the fin-shaped structure 210, the hard mask layer 310 may also be referred to as a fin-top hard mask layer 310. The fin-shaped structure 210 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 6, the etch process at block 110 forms trenches extending through the stack 204 and a portion of the substrate 202. The trenches define the fin-shaped structures 210 (one shown in FIG. 6). In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 210 by etching the stack 204. As shown in FIG. 6, the fin-shaped structure 210, along with the sacrificial layers 206 and the channel layers 208 therein, extends lengthwise along the X direction.

Figure 7:
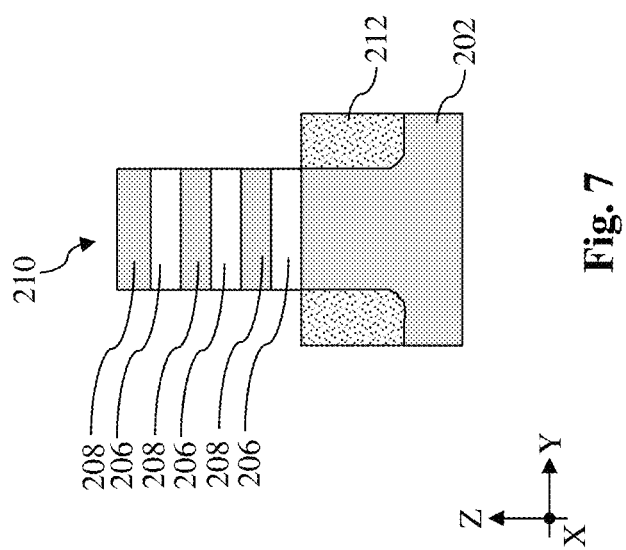

As illustrated in FIG. 7, at block 110, an isolation feature 212 may be formed adjacent the base of the fin-shaped structure 210. In some embodiments, the isolation feature 212 may be formed in the trenches to isolate the fin-shaped structures 210 from a neighboring active region (not explicitly shown). The isolation feature 212 may also be referred to as a shallow trench isolation (STI) feature 212. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 212. The fin-shaped structure 210 rises above the STI feature 212 after the recessing.

Figure 8:
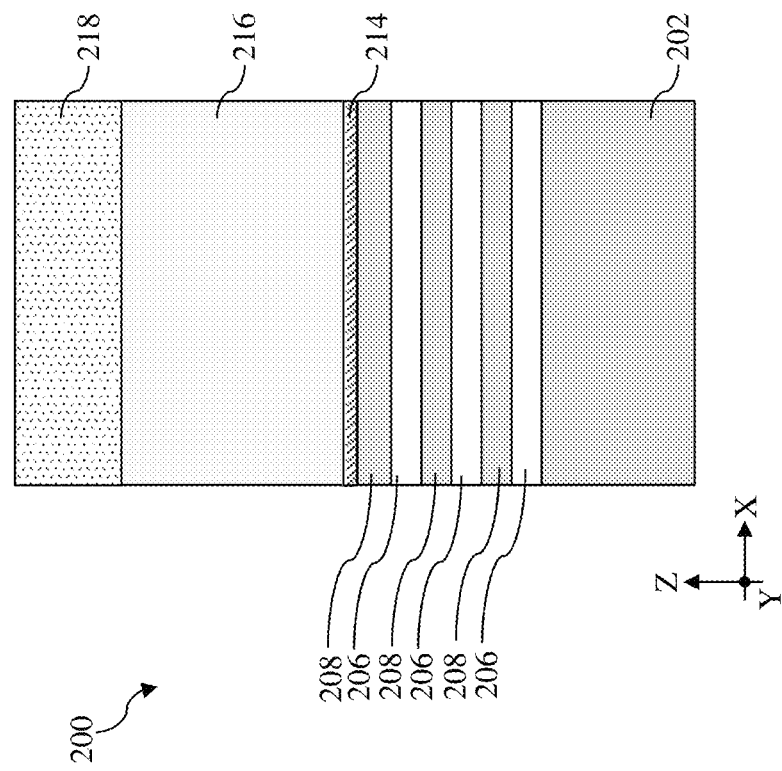
Figure 9:
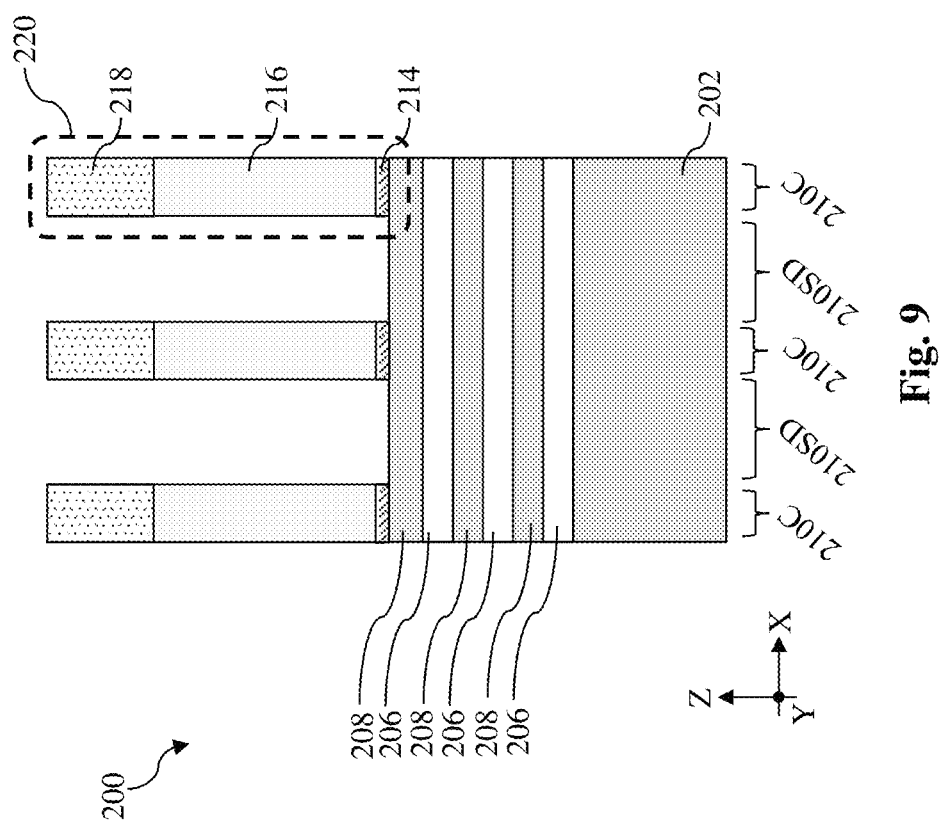

Referring to FIGS. 1, 8 and 9, method 100 includes a block 112 where a dummy gate stack 220 is formed over a channel region 210C of the fin-shaped structure 210. In some embodiments, a gate replacement process (or gate-last process) is adopted where the dummy gate stack 220 (shown in FIG. 9) serves as a placeholder to undergo various processes and is to be removed and replaced by the functional gate structure. Other processes and configuration are possible. In some embodiments illustrated in FIG. 9, the dummy gate stack 220 is formed over the fin-shaped structure 210 and the fin-shaped structure 210 may be divided into channel regions 210C underlying the dummy gate stacks 220 and source/drain regions 210SD that do not underlie the dummy gate stacks 220. The channel regions 210C are adjacent the source/drain regions 210SD. As shown in FIG. 9, the channel region 210C is disposed between two source/drain regions 210SD.

The formation of the dummy gate stack 220 may include deposition of layers in the dummy gate stack 220, shown in FIG. 8, and patterning of these layers, shown in FIG. 9. Referring to FIG. 8, a dummy dielectric layer 214, a dummy electrode layer 216, and a gate-top hard mask layer 218 may be blanketly deposited over the workpiece 200. In some embodiments, the dummy dielectric layer 214 may be deposited on the fin-shaped structure 210 using a chemical vapor deposition (CVD) process, an ALD process, or other suitable processes. In some instances, the dummy dielectric layer 214 may include silicon oxide. Thereafter, the dummy electrode layer 216 may be deposited over the dummy dielectric layer 214 using a CVD process, an ALD process, or other suitable processes. In some instances, the dummy electrode layer 216 may include polysilicon. For patterning purposes, the gate-top hard mask layer 218 may be deposited on the dummy electrode layer 216 using a CVD process, an ALD process, or other suitable processes. The gate-top hard mask layer 218, the dummy electrode layer 216 and the dummy dielectric layer 214 may then be patterned to form the dummy gate stack 220, as shown in FIG. 9. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 218 may include a silicon oxide layer and a silicon nitride layer.

Figure 10:
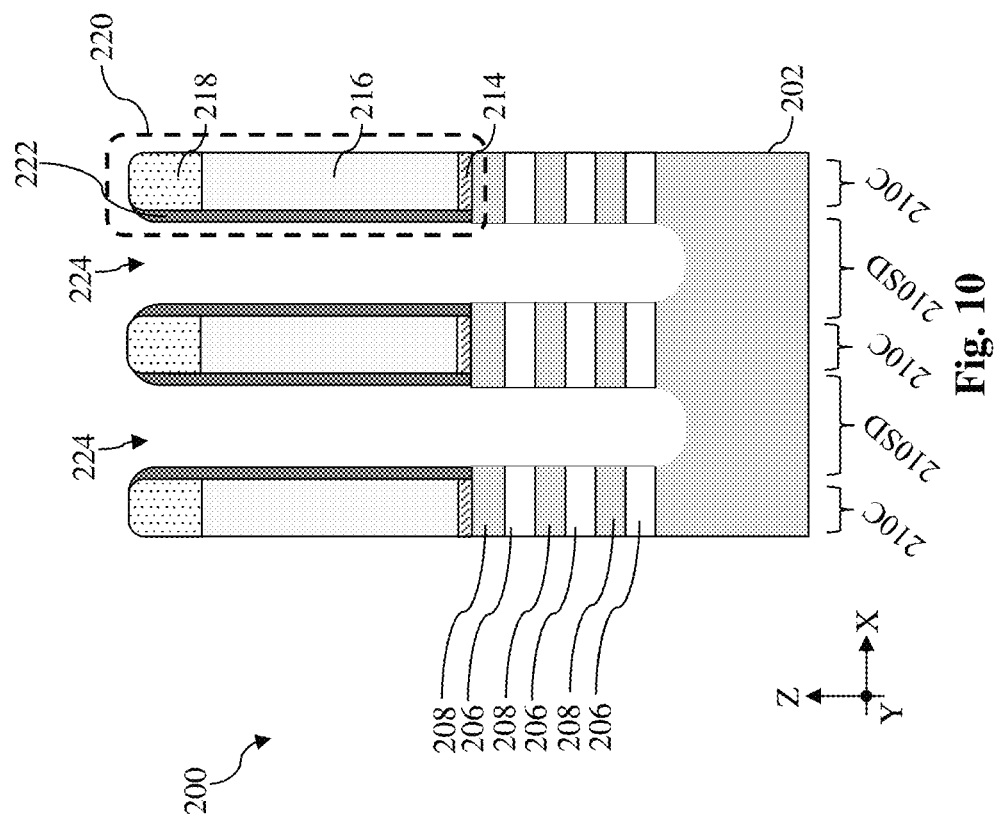

Referring to FIGS. 1 and 10, method 100 includes a block 114 where a gate spacer layer 222 is deposited over the dummy gate stack 220. In some embodiments, the gate spacer layer 222 is deposited conformally over the workpiece 200, including over top surfaces and sidewalls of the dummy gate stack 220. The term "conformally" may be used herein for ease of description of a layer having substantially uniform thickness over various regions. The gate spacer layer 222 may have a single-layer construction or include multiple layers. In some embodiments represented in FIG. 10, the gate spacer layer 222 may include silicon carbonitride, silicon oxycarbide, silicon oxycarbonitride, or silicon nitride. The gate spacer layer 222 may be deposited over the dummy gate stack 220 using processes such as, a CVD process, a subatmospheric CVD (SACVD) process, an ALD process, or other suitable process.

Referring to FIGS. 1 and 10, method 100 includes a block 116 where a source/drain region 210SD of the fin-shaped structure 210 is recessed to form a source/drain trench 224. In some embodiments, the source/drain regions 210SD that are not covered by the dummy gate stack 220 are etched by a dry etch or a suitable etching process to form the source/drain trenches 224. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIG. 10, the source/drain regions 210SD of the fin-shaped structure 210 are recessed to expose sidewalls of the sacrificial layers 206 and the channel layers 208. In some implementations, the source/drain trenches 224 extend below the stack 204 into the substrate 202. At block 116, portions of the gate spacer layer 222 over the source/drain regions 210SD are etched away while portions of the gate spacer layer 222 extending along sidewalls of the dummy gate stacks 220 remain. As shown in FIG. 10, the sacrificial layers 206 and channel layers 208 in the source/drain region 210SD are removed at block 116, exposing the substrate 202.

Figure 11:
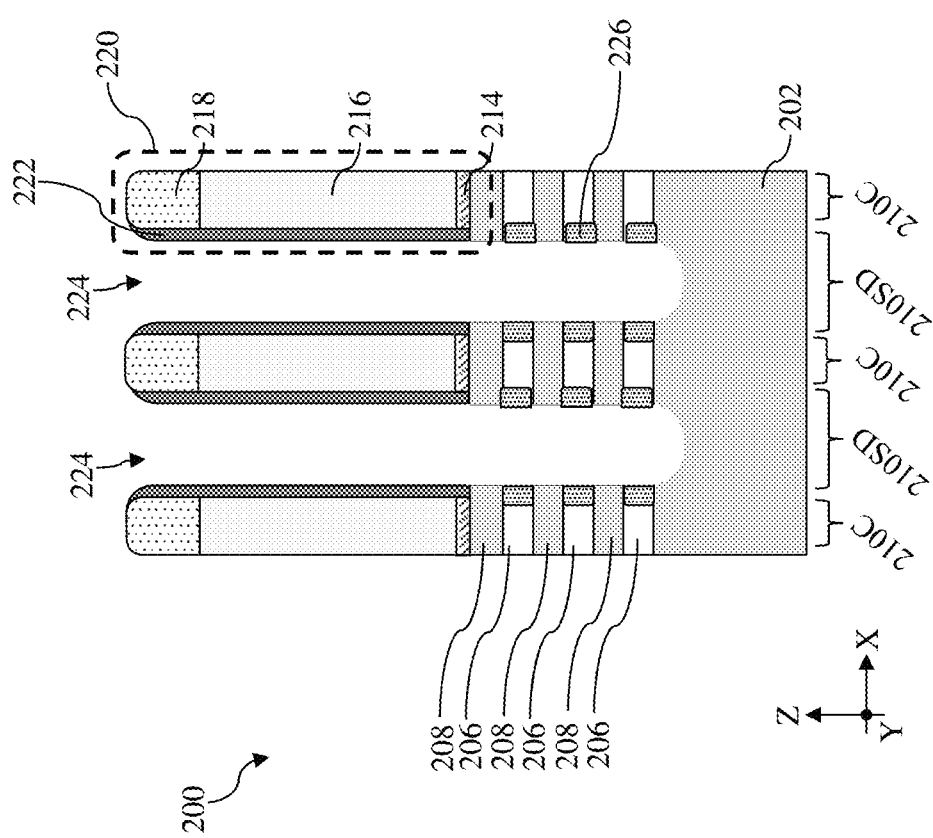

Referring to FIGS. 1 and 11, method 100 includes a block 118 where inner spacer features 226 are formed. While not shown explicitly, operation at block 118 may include selective and partial removal of the sacrificial layers 206 to form inner spacer recesses, deposition of inner spacer material over the workpiece, and etch back the inner spacer material to form inner spacer features 226 in the inner spacer recesses. The sacrificial layers 206 exposed in the source/drain trenches 22 are selectively and partially recessed to form inner spacer recesses (occupied by the inner spacer features 226 in FIG. 11) while the gate spacer layer 222, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone. In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant.

The inner spacer material for the inner spacer features 226 may include metal oxides, silicon oxide, silicon oxycarbonitride, silicon nitride, silicon oxynitride, carbon-rich silicon carbonitride, or a low-k dielectric material. The metal oxides here may include aluminum oxide, zirconium oxide, tantalum oxide, yttrium oxide, titanium oxide, lanthanum oxide, or other suitable metal oxide. While not explicitly shown, the inner spacer material may be a single layer or a multilayer. In some implementations, the inner spacer material for the inner spacer features 226 may be deposited using CVD, PECVD, SACVD, ALD or other suitable methods. The inner spacer material for the inner spacer features 226 is deposited into the inner spacer recesses as well as over the sidewalls of the channel layers 208 exposed in the source/drain trenches 224. The deposited inner spacer material is then etched back to remove the inner spacer material from the sidewalls of the channel layers 208 to form the inner spacer features 226 in the inner spacer recesses. At block 118, the inner spacer material may also be removed from the top surfaces and/or sidewalls of the gate-top hard mask layer 218, the gate spacer layer 222, and the isolation features 212. In some implementations, the etch back operations performed at block 118 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 11, each of the inner spacer features 226 is in direct contact with the recessed sacrificial layers 206 and is disposed between two neighboring channel layers 208.

Figure 12:
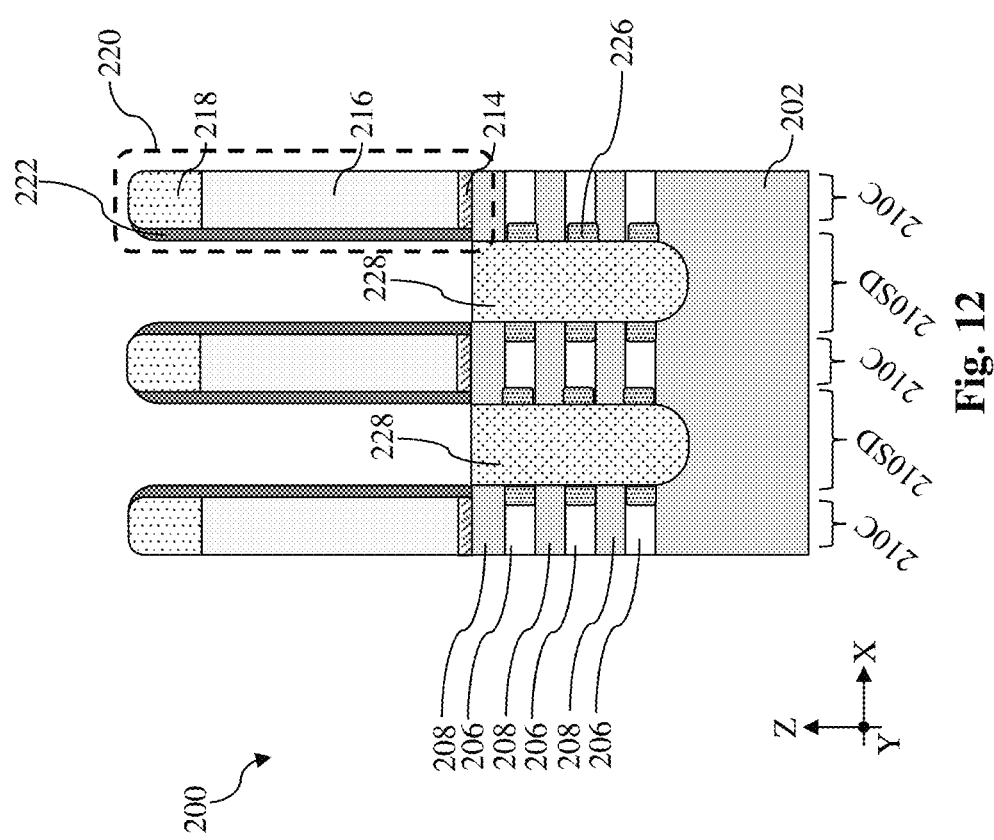

Referring to FIGS. 1 and 12, method 100 includes a block 120 where source/drain features 228 are formed in the source/drain trench 224. In some implementations, the source/drain features 228 may be epitaxially and selectively formed from the exposed sidewalls of the channel layers 208 and exposed surfaces of the substrate 202. Sidewalls of the sacrificial layers 206 remain covered by the inner spacer features 226. Suitable epitaxial processes for block 120 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process at block 120 may use gaseous and/or liquid precursors, which interact with the composition of the substrate 202 as well as the channel layers 208. In some embodiments, parameters of the epitaxial growth process at block 120 are selected such that the source/drain features 228 are not epitaxially deposited on the inner spacer features 226. In those embodiments, overgrowth of the source/drain features 228 from the channel layers 208 and substrate 202 may merge over the inner spacer features 226. Depending on types of transistors to be formed on the workpiece 200, the source/drain features 228 may be n-type or p-type. When the source/drain feature 228 is n-type, the source/drain features 228 may include silicon (Si) and may be doped with an n-type dopant, such as phosphorus (P), arsenic (As), or antimony (Sb). When the source/drain feature 228 is p-type, the source/drain features 228 may include silicon (Si), germanium (Ge), germanium tin (GeSn) or silicon germanium (SiGe) and may be doped with a p-type dopant, such as boron (B) or gallium (Ga).

Figure 13:
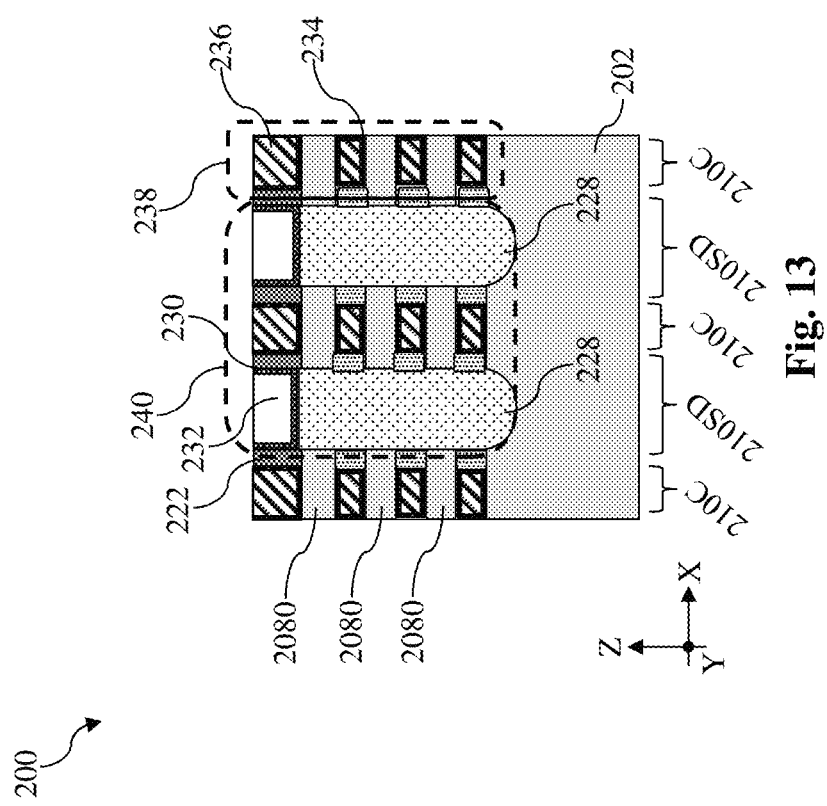

Referring to FIGS. 1 and 13, method 100 includes a block 122 where further processes are performed. Such further processes may include, for example, deposition of a contact etch stop layer (CESL) 230 over the workpiece 200, deposition of an interlayer dielectric (ILD) layer 232 over the CESL 230, removal of the dummy gate stack 220, selective removal of the sacrificial layers 206 in the channel region 210C to release the channel layers 208 as channel members 2080, and formation of a gate structure 238 over the channel region 210C. Referring now to FIG. 13, the CESL 230 is formed prior to forming the ILD layer 232. In some examples, the CESL 230 includes a silicon nitride layer, a silicon oxide layer, a silicon oxynitride layer, and/or other materials known in the art. The CESL 230 may be formed by ALD, plasma-enhanced chemical vapor deposition (PECVD) process and/or other suitable deposition or oxidation processes. The ILD layer 232 is then deposited over the CESL 230. In some embodiments, the ILD layer 232 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 232 may be deposited by CVD, spin-on coating, or other suitable deposition technique. In some embodiments, after formation of the ILD layer 232, the workpiece 200 may be annealed to improve integrity of the ILD layer 232. As shown in FIG. 13, the CESL 230 may be disposed directly on top surfaces of the source/drain feature 228.

After the deposition of the CESL 230 and the ILD layer 232, the workpiece 200 may be planarized by a planarization process to expose the dummy gate stack 220 (shown in FIG. 12). For example, the planarization process may include a chemical mechanical planarization (CMP) process. Exposure of the dummy gate stack 220 allows the removal of the dummy gate stack 220 and release of the channel layers 208. In some embodiments, the removal of the dummy gate stack 220 results in a gate trench over the channel regions 210C. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 210C are exposed in the gate trench.

After the removal of the dummy gate stack 220, the method 100 may include operations to selectively remove the sacrificial layers 206 between the channel layers 208 in the channel region 210C. The selective removal of the sacrificial layers 206 releases the channel layers 208 to form channel members 2080. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments where the sacrificial layers 206 are formed of silicon germanium, the selective removal includes silicon germanium oxidation followed by a silicon germanium oxide removal. For example, the oxidation may be provided by ozone clean and then silicon germanium oxide removed by an etchant such as $NH_4OH$.

The method 100 may include further operations to form the gate structure 238 to wrap around each of the released channel members 2080. In some embodiments, the gate structure 238 is formed within the gate trench and into the space left behind by the removal of the sacrificial layers 206 to wrap around each of the channel members 2080. In various embodiments, the gate structure 238 includes a gate dielectric layer 234 and a gate electrode layer 236 formed over the gate dielectric layer 234. While not explicitly shown, the gate dielectric layer 234 includes an interfacial layer on the channel members 2080 and a high-k dielectric layer over the interfacial layer. Here, high-K dielectric materials, as used and described herein, include dielectric materials having a high dielectric constant, for example, greater than that of thermal silicon oxide (~3.9). The interfacial layer may include silicon oxide or hafnium silicate. The interfacial layer may be formed by chemical oxidation, cleaning, thermal oxidation, atomic layer deposition (ALD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer 236 of the gate structure 238 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 236 of the gate structure 238 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 236 of the gate structure 238 may be formed by ALD, PVD, CVD, e-beam evaporation, or other suitable process. Further, the gate electrode layer 236 may be formed separately for n-type and p-type transistors which may use different metal layers (e.g., for providing different n-type and p-type work function metal layers). In various embodiments, a CMP process may be performed to remove excessive metal, thereby providing a substantially planar top surface of the gate structure 238. The gate structure 238 includes portions that interpose between channel members 2080 in the channel region 210C. Upon conclusion of operation at block 122, an MBC transistor 240 is formed. Depending on the design of the semiconductor device 200, the MBC transistor 240 may be n-type or p-type.

Although not intended to be limiting, one or more embodiments of the present disclosure provide methods for reducing the number or dimensions of germanium humps when a stack having a germanium-containing top layer is patterned to form a fin-shaped structure. Such methods may include forming a pad oxide layer using a low-level of oxygen plasma, forming a pad nitride layer using plasma-enhanced atomic layer deposition (PEALD) or plasma-enhanced chemical vapor deposition (PECVD) at a low temperature for a short period of time, or a combination thereof. Use of low-level oxygen plasma may lessen germanium oxide, which is a reactant in a reduction chemical reaction to form germanium precipitation. The low temperature and short process time during the formation of the pad nitride layer may decrease thermal energy input and slow down reduction reaction of germanium oxide to form germanium. By lessening germanium oxide formation and/or slowing down the reduction reaction of germanium oxide, method of the present disclosure may decrease germanium precipitation, thereby improving uniformity of fin-shaped structures and overall yield.

In one exemplary aspect, the present disclosure is directed to a method. The method includes receiving a workpiece including a stack of semiconductor layers, the stack including a germanium-containing top layer, depositing a first pad oxide layer on the germanium-containing top layer, depositing a second pad oxide layer on the first pad oxide layer, depositing a pad nitride layer on the second pad oxide layer, and patterning the stack using the first pad oxide layer, the second pad oxide layer, and the pad nitride layer as a hard mask layer. The depositing of the first pad oxide layer includes a first oxygen plasma power. The depositing of the second pad oxide layer includes a second oxygen plasma power greater than the first oxygen plasma power. In some embodiments, a ratio of the second oxygen plasma power to the first oxygen plasma power is between about 2 and about 3. In some implementations, a thickness in the first pad oxide layer is identical to a thickness in the second pad oxide layer. In some instances, the first pad oxide layer includes a thickness between about 8 Å and about 12 Å and the second pad oxide layer includes a thickness between about 8 Å and about 12 Å. In some embodiments, the depositing of the pad nitride layer includes use of plasma-enhanced atomic layer deposition (PEALD) or plasma-enhanced chemical vapor deposition (PECVD). In some instances, the depositing of the pad nitride layer includes a process temperature between about 350° C. and about 450° C. In some implementations, the depositing of the pad nitride layer includes a duration between about 25 minutes and about 35 minutes.

In another exemplary aspect, the present disclosure is directed to a method. The method includes receiving a workpiece including a stack of semiconductor layers, wherein a top layer of the stack includes germanium, depositing a first pad oxide layer on the top layer, depositing a pad nitride layer over the first pad oxide layer, wherein the depositing of the pad nitride layer includes use of plasma-enhanced atomic layer deposition (PEALD) or plasma-enhanced chemical vapor deposition (PECVD) and a process temperature between about 350° C. and about 450° C., and patterning the stack using at least the first pad oxide layer and the pad nitride layer as a hard mask layer. In some embodiments, the depositing of the pad nitride layer includes a duration between about 25 minutes and about 35 minutes. In some implementations, the top layer includes germanium or silicon germanium. In some instances, the depositing of the first pad oxide layer includes a first oxygen plasma power between about 550 Watts and about 800 Watts. In some embodiments, the method may further include before the depositing of the pad nitride layer, depositing a second pad oxide layer on the first pad oxide layer. The depositing of the second pad oxide layer includes a second oxygen plasma power. A ratio of the second oxygen plasma power to the first oxygen plasma power is between about 2 and about 3. In some instances, a thickness in the first pad oxide layer is identical to a thickness in the second pad oxide layer. In some implementations, the first pad oxide layer includes a thickness between about 8 Å and about 12 Å and the second pad oxide layer includes a thickness between about 8 Å and about 12 Å.

In yet another exemplary aspect, the present disclosure is directed to a method. The method includes receiving a workpiece including a stack of semiconductor layers, wherein a top layer of the stack includes silicon germanium, depositing a first pad oxide layer on the top layer, depositing a second pad oxide layer on the first pad oxide layer, depositing a pad nitride layer on the second pad oxide layer, and patterning the stack to form a fin-shaped structure, where the patterning includes use of the first pad oxide layer, the second pad oxide layer, and the pad nitride layer as a hard mask layer. The depositing of the pad nitride layer includes use of plasma-enhanced atomic layer deposition (PEALD) or plasma-enhanced chemical vapor deposition (PECVD) and a process temperature between about 350° C. and about 450° C.

In some embodiments, the depositing of the pad nitride layer includes a duration between about 25 minutes and about 35 minutes. In some implementations, an etch rate of the first pad oxide layer in diluted hydrogen fluoride (DHF) is greater than an etch rate of the second pad oxide layer in DHF. In some instances, the depositing of the first pad oxide layer includes a first oxygen plasma power and the depositing of the second pad oxide layer includes a second oxygen plasma power greater than the first oxygen plasma power. In some embodiments, a ratio of the second oxygen plasma power to the first oxygen plasma power is between about 2 and about 3. In some instances, a thickness in the first pad oxide layer is identical to a thickness in the second pad oxide layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising a stack of semiconductor layers, the stack comprising a germanium-containing top layer;
   after the receiving, depositing a first pad oxide layer directly on the germanium-containing top layer;
   after the depositing of the first pad oxide layer, depositing a second pad oxide layer directly on the first pad oxide layer;
   after the depositing of the second pad oxide layer, depositing a pad nitride layer directly on the second pad oxide layer; and
   patterning the stack using the first pad oxide layer, the second pad oxide layer, and the pad nitride layer as a hard mask layer,
   wherein the depositing of the first pad oxide layer comprises a first oxygen plasma power,
   wherein the depositing of the second pad oxide layer comprises a second oxygen plasma power greater than the first oxygen plasma power.

2. The method of claim 1,
   wherein a ratio of the second oxygen plasma power to the first oxygen plasma power is between about 2 and about 3.

3. The method of claim 1, wherein a thickness in the first pad oxide layer is identical to a thickness in the second pad oxide layer.

4. The method of claim 1,
   wherein the first pad oxide layer comprises a thickness between about 8 Å and about 12 Å,
   wherein the second pad oxide layer comprises a thickness between about 8 Å and about 12 Å.

5. The method of claim 1, wherein the depositing of the pad nitride layer comprises use of plasma-enhanced atomic layer deposition (PEALD) or plasma-enhanced chemical vapor deposition (PECVD).

6. The method of claim 1, wherein the depositing of the pad nitride layer comprises a process temperature between about 350° C. and about 450° C.

7. The method of claim 1, wherein the depositing of the pad nitride layer comprises a duration between about 25 minutes and about 35 minutes.

8. A method, comprising:
   receiving a workpiece comprising a stack of semiconductor layers, wherein a top layer of the stack comprises germanium;
   depositing a first pad oxide layer on the top layer, wherein the depositing of the first pad oxide layer comprises a first oxygen plasma power between about 550 Watts and about 800 Watts;
   depositing a pad nitride layer over the first pad oxide layer, wherein the depositing of the pad nitride layer comprises use of plasma-enhanced atomic layer deposition (PEALD) or plasma-enhanced chemical vapor deposition (PECVD) and a process temperature between about 350° C. and about 450° C.; and
   patterning the stack using at least the first pad oxide layer and the pad nitride layer as a hard mask layer.

9. The method of claim 8, wherein the depositing of the pad nitride layer comprises a duration between about 25 minutes and about 35 minutes.

10. The method of claim 8, wherein the top layer comprises germanium or silicon germanium.

11. The method of claim 8, further comprising:
    before the depositing of the pad nitride layer, depositing a second pad oxide layer on the first pad oxide layer, wherein the depositing of the second pad oxide layer comprises a second oxygen plasma power, wherein a ratio of the first oxygen plasma power to the second oxygen plasma power is between about 2 and about 3.

12. The method of claim 11, wherein a thickness in the first pad oxide layer is identical to a thickness in the second pad oxide layer.

13. The method of claim 11, wherein the first pad oxide layer comprises a thickness between about 8 Å and about 12 Å, wherein the second pad oxide layer comprises a thickness between about 8 Å and about 12 Å.

14. A method, comprising:
    receiving a workpiece comprising a stack of semiconductor layers, wherein a top layer of the stack comprises silicon germanium;
    depositing a first pad oxide layer on the top layer;
    depositing a second pad oxide layer on the first pad oxide layer;
    depositing a pad nitride layer on the second pad oxide layer; and
    patterning the stack to form a fin-shaped structure, where the patterning comprises use of the first pad oxide layer, the second pad oxide layer, and the pad nitride layer as a hard mask layer, wherein the depositing of the pad nitride layer comprises use of plasma-enhanced atomic layer deposition (PEALD) or plasma-enhanced chemical vapor deposition (PECVD) and a process temperature between about 350° C. and about 450° C., wherein an etch rate of the first pad oxide layer in diluted hydrogen fluoride (DHF) is greater than an etch rate of the second pad oxide layer in DHF.

15. The method of claim 14, wherein the depositing of the pad nitride layer comprises a duration between about 25 minutes and about 35 minutes.

16. The method of claim 14,
wherein the depositing of the first pad oxide layer comprises a first oxygen plasma power,
wherein the depositing of the second pad oxide layer comprises a second oxygen plasma power greater than the first oxygen plasma power.

17. The method of claim 16,
wherein a ratio of the second oxygen plasma power to the first oxygen plasma power is between about 2 and about 3.

18. The method of claim 16, wherein a thickness in the first pad oxide layer is identical to a thickness in the second pad oxide layer.

19. The method of claim 1, wherein the first pad oxide layer and the second pad oxide layer comprise silicon oxide.

20. The method of claim 11,
wherein the first pad oxide layer and the second pad oxide layer comprise silicon oxide,
wherein the depositing of the pad nitride layer comprises depositing the pad nitride layer directly on the second pad oxide layer.

* * * * *